United States Patent [19]
Jackson et al.

[11] Patent Number: 5,815,104
[45] Date of Patent: Sep. 29, 1998

[54] METHOD AND APPARATUS FOR DIGITAL TO ANALOG CONVERSION

[75] Inventors: H. Spence Jackson, Austin; Michael A. Margules, Dripping Springs, both of Tex.

[73] Assignee: Sigmatel, Inc., Austin, Tex.

[21] Appl. No.: 821,097

[22] Filed: Mar. 20, 1997

[51] Int. Cl.[6] .................................................. H03M 1/66
[52] U.S. Cl. ............................................................ 341/144
[58] Field of Search ..................................... 341/144, 154, 341/120, 143, 145

[56] References Cited

U.S. PATENT DOCUMENTS 5,592,165  1/1997  Jackson et al. .......................... 341/143
5,602,552  2/1997  Hirose et al. ............................ 341/154

Primary Examiner—Brian K. Young
Attorney, Agent, or Firm—Timothy W. Markison

[57] ABSTRACT

A method and apparatus for converting a digital signal into an analog signal with minimal self generated noise is achieved by a digital to analog converter that includes a current source, a switch circuit, and a gating circuit. The current source provides a current, which is representative of digital data, to the switch circuit. The switch circuit, based on control signals provided by the gating circuit, routes the current to an analog node and/or a reference potential node. The control signals cause the switch circuit to route the current to both nodes when a clock pulse signal is in a first state regardless of the state of the data, to route the current to the analog node when the clock pulse signal is in a second state and digital data is in a second state, and to route the current to the reference potential node when the clock pulse signal is in the second state and the digital data is in a first state. In this manner, an analog representation of the digital data is present at the analog node.

14 Claims, 7 Drawing Sheets

METHOD AND APPARATUS FOR DIGITAL TO ANALOG CONVERSION

TECHNICAL FIELD OF THE INVENTION

This invention relates generally to digital to analog conversion and more particularly to a noise reduced digital to analog converter.

BACKGROUND OF THE INVENTION

The art of converting a digital signal to an analog signal is well known. It is also well known that such a conversion may be done by a variety of different circuits. One such digital to analog converter (DAC) is described in U.S. Pat. No. 5,592,165 issued to Jackson and Margules, assigned to both SigmaTel, Inc. and Dallas Semiconductor Corporation. In this patent, a new DAC architecture is described to include a Sigma Delta Modulator and a Finite Impulse Response (FIR) filter.

One novel aspect of the DAC of the '165 patent is that it includes a plurality of matched current sources which are used to provide the coefficients for the FIR filter. Such current sources are coupled to corresponding locations in a shift register and to either a summing node or a divider circuit. By coupling the current sources in this manner, the coefficients are trimmed to precise values. While this new DAC provides many advantages over previous DACs, it does have some limitations. For example, the DAC has difficulty in providing a signal to noise ratio of 90 dB due to self generated noise.

One cause for the self generated noise is that the current supplied to the summing node or the divider circuit is asymmetrical due to differences between the rise time and fall time of a data transition (Eg.1 to 0, or 0 to 1) of the shift register. The asymmetry is further pronounced because the data does not always change states. Thus, current is provided for a longer duration when there is no transition than when there is a transition and the current is provided for varying durations when there is a transition because of the differences in rise and fall times.

Another cause for the self generated noise occurs when the current sources are switched from sourcing current to the summing node, or the divider circuit, to sourcing current to a reference node. Note that, when the data is representative of a logic 1, current is supplied to the summing node or the divider circuit and, when the data is representative of a logic 0, current is supplied to the reference node. This type of either-or switching injects a small amount of noise into the circuit which cannot be filtered out because it is data dependent.

Therefore a need exists for a method and apparatus to reduce the amount of self generated noise in a digital to analog converter.

DETAILED DISCUSSION OF THE DRAWINGS

Generally, the present invention provides a method and apparatus for converting a digital signal into an analog signal with minimal self generated noise. The digital to analog converter includes a current source, a switch circuit, and a gating circuit. The current source provides a current, which is representative of digital data, to the switch circuit. The switch circuit, based on control signals from the gating circuit, routes the current to an analog node and/or to a reference potential node. The control signals cause the switch circuit to route the current to both nodes when a clock pulse signal is in a first state regardless of the state of the data, to route the current to the analog node when the clock pulse signal is in a second state and digital data is in a second state, and to route the current to the reference potential node when the clock pulse signal is in the second state and the digital data is in a first state. Thereby producing an analog representation of the digital data at the analog node. By routing the current in this fashion, a make-before-break switching occurs, thus substantially eliminating self generated noise that is produced because of the switching. In addition, elimination of the self generated noise, which is produced by variances in rise and fall times and in data transitions, is achieved because at each clock pulse there is a forced partial transition. Further, because the forced partial transitions are dependent on the clock and not on the data, the small amount of noise that is produced can be filtered.

Figure 1:
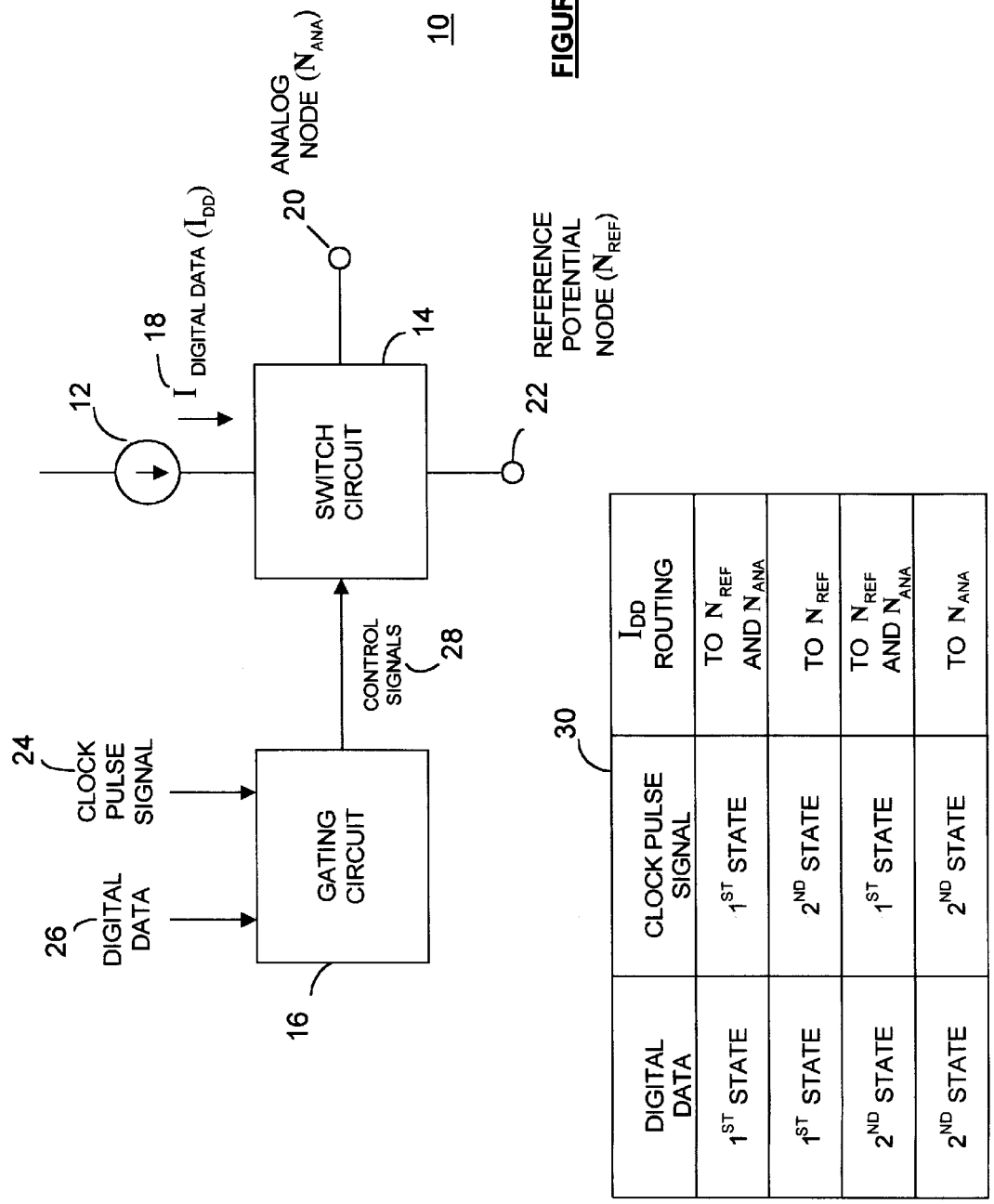
FIG. 1 illustrates a schematic block diagram of a digital to analog converter which is in accordance with the present invention.

The present invention can be more fully described with reference to FIGS. 1–7. FIG. 1 illustrates a digital to analog converter 10 that includes a current source 12, a switch circuit 14, and a gating circuit 16. The current source 12 produces current 18, which is representative of digital data 26, and provides the current 18 to the switch circuit 14. The switch circuit 14 routes the current 18 to an analog node 20 and/or to a reference potential node 22 based on control signals 28 received from the gating circuit 16. The gating circuit 16 produces the control signals 28 based on the state of its inputs: the digital data 26 and a clock pulse signal 24.

Table 30 illustrates the resulting control signals 28 from the differing states of the inputs 24, 26. As shown, when the clock pulse signal 24 is in the first state, control signals 28 are produced which cause the switch circuit 14 to route the current 18 to both the analog node 20 and the reference potential node 22. When the clock pulse signal 24 is in a second state, control signals 28 are produced which cause the switch circuit 14 to route the current 18 to the analog node 20 when the digital data 26 is in a second state and to route the current 18 to the reference potential node 22 when the digital data 26 is in a first state.

In operation, the clock pulse signal 24 is produced from a system clock which is used to clock in the digital data 26. The duration of the clock pulse signal 24 should be much greater (Eg.>than 10 times) than the switching times of the switching circuit 14. When the digital data is clocked in, it is provided to the gating circuit 16 and used to produce the current 18. When the digital data 26 is in the second state (Eg. a logic '1'), the current is routed to the analog node 20. When the digital data 26 is in the first state (Eg. a logic '0'), the current is routed to the reference potential node 22. When the clock pulse signal is in the first state (Eg. a logic '0'), the current 18 is routed to both nodes 20 and 22. As one skilled in the art will readily appreciate, a current-to-voltage device needs to be coupled to the analog node 20 if the desired analog output is to be a voltage. Such a person would also note that the current source 12 may produce a constant current, as opposed to a representative current of the digital data, where the gating circuit controls whether the current will be used to produce an analog signal or dumped in to the reference potential node.

Figure 2:
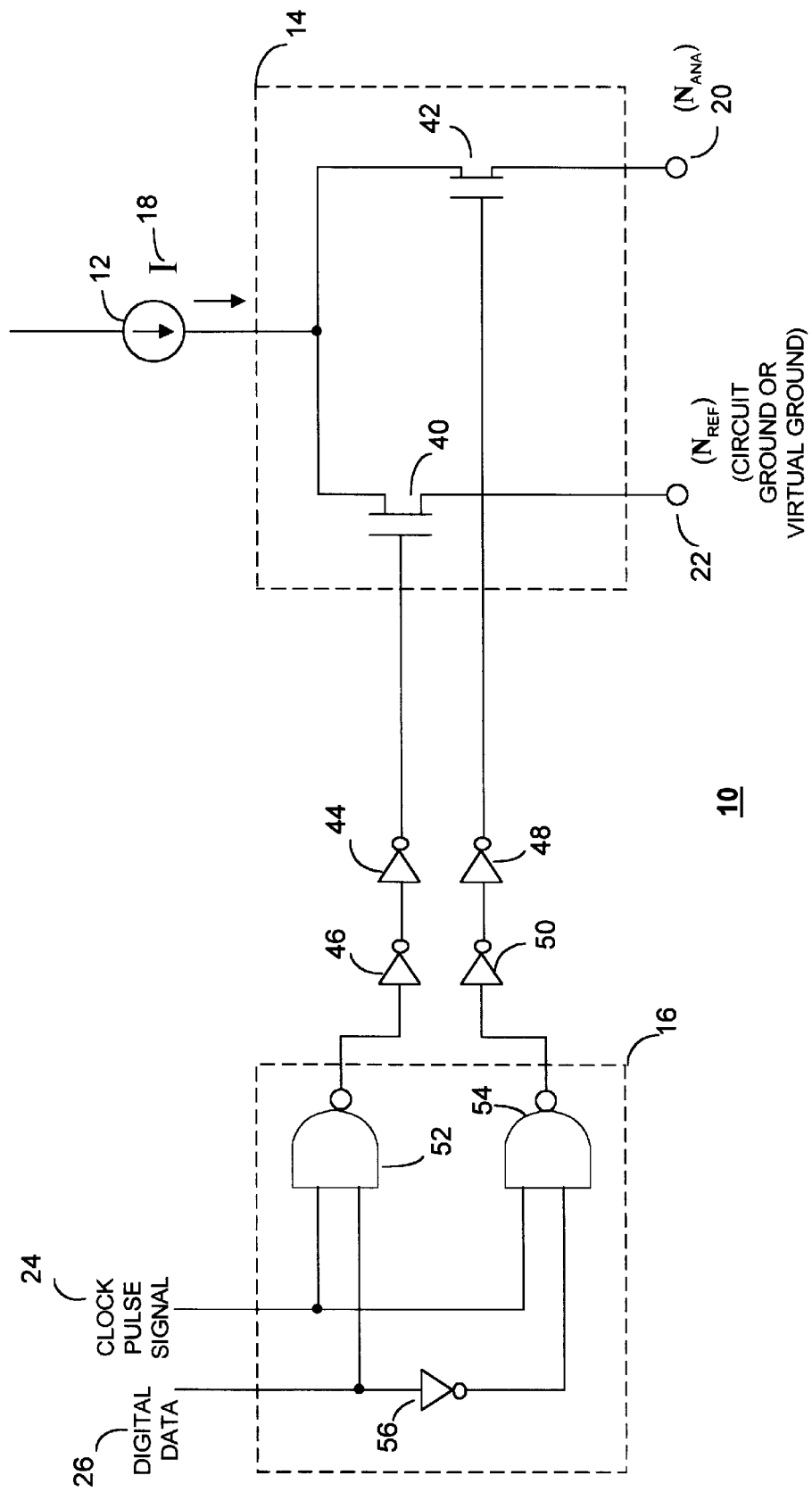
FIG. 2 illustrates a variant embodiment of the digital to analog converter of FIG. 1.

FIG. 2 illustrates a variant embodiment of the digital to analog converter 10. As shown, the switch circuit 14 includes transistor 40 and transistor 42, where transistor 40, when active, routes the current 18, or a portion thereof, to the reference potential node 22. Transistor 42, when active, routes the current 18, or a portion thereof, to the analog node 20. Note that transistors 40 and 42 may be N-channel transistors, P-channel transistors, or bipolar transistors. Further note that the reference potential node 22 may be coupled to the circuit ground (0 volts, or the negative supply voltage) or a virtual ground (a fixed voltage somewhere between the positive and negative rails).

The gating circuit 16 includes NAND gate 52, NAND gate 54, and an inverter 56. Both NAND gates 52 and 54 receive, as an input, the clock pulse signal 24, such that, when the clock pulse signal is low, the output of the NAND gates 52 and 54 are high regardless of the state of the digital data 26. When the output of the NAND gates 52 and 54 are high, transistors 40 and 42, which, for N-channel transistors, would be active (i.e., switched on). The other input of NAND gate 52 is coupled to receive the digital data 26, while the other input of NAND gate 54 is coupled to receive the inversion of the digital data 26. The digital to analog converter 10 may also include a pair of inverters 44 & 46 and 48 & 50 operably coupled between the outputs of the gating circuit 16 and the inputs of the switch circuit 14.

In operation, when the clock pulse signal 24 is high and the digital data 26 is high, the output of NAND gate 52 is low, turning transistor 40 off, while the output of NAND gate 54 is high, turning on transistor 42. Thus, with both the clock pulse signal 24 and the digital data 26 being high, the current 18 is routed to the analog node 20. Conversely, when the clock pulse signal 24 is high, but the digital data 26 is low, the output of NAND gate 54 is low while the output of NAND gate 52 is high. In this state, transistor 40 is on, and transistor 42 is off, such that the current 18 is routed to the reference potential node 22. As one skilled in the art will readily appreciate, if transistors 40 and 42 are P-channel, the polarity of the input signals would be inverted.

Figure 3:
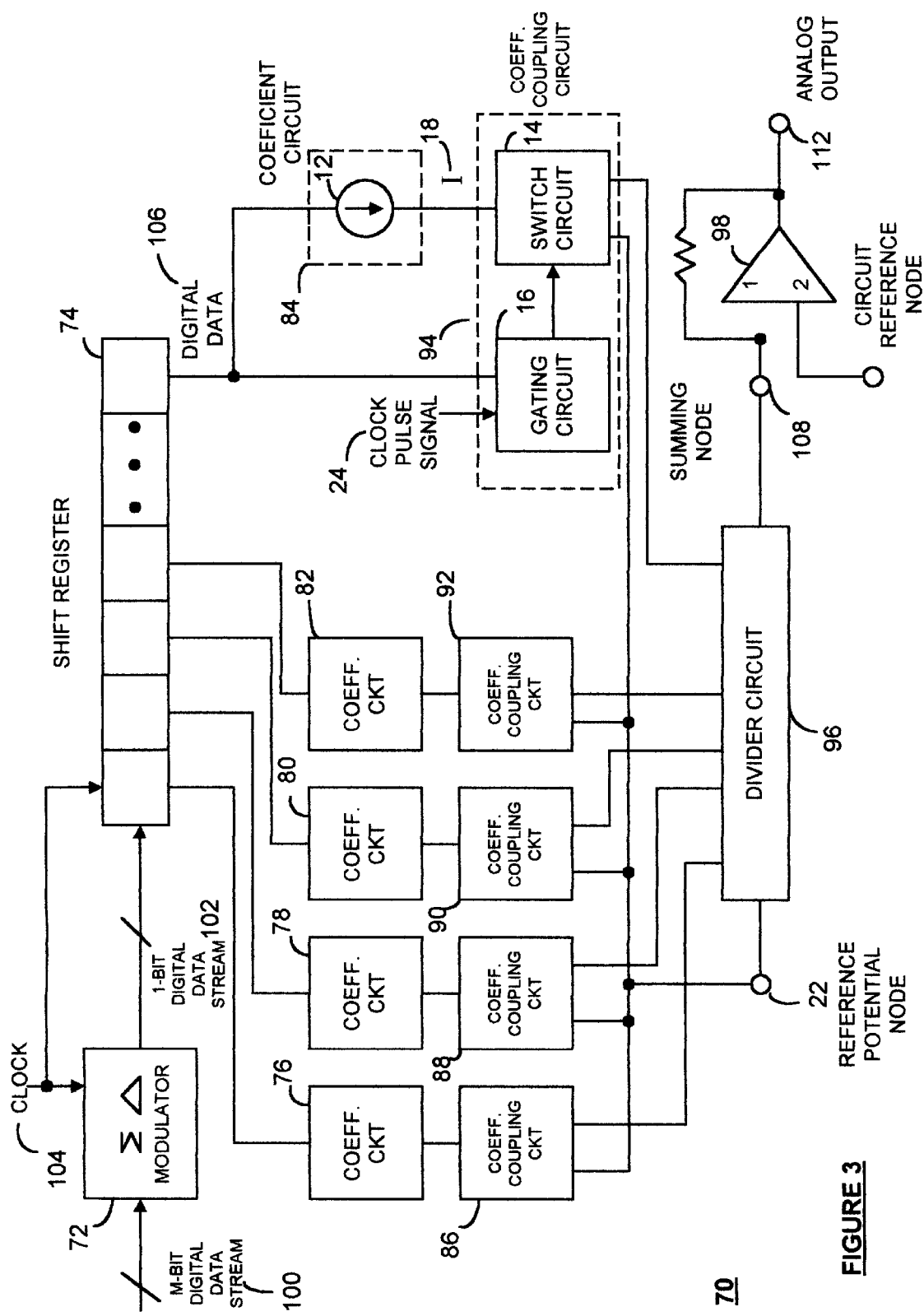
FIG. 3 illustrates an alternate embodiment of a digital to analog converter which is in accordance with the present invention.

FIG. 3 illustrates an alternate embodiment of a digital to analog converter 70 which includes a sigma-delta modulator 72, a shift register 74, a plurality of coefficient circuits 76, 78, 80, 82, and 84, a plurality of coefficient coupling circuits 86, 88, 90, 92, and 94, an amplifier 98, and a divider circuit 96. Each of the coefficient circuits 76, 78, 80, 82, and 84 is coupled to a corresponding location in the shift register 74 and to a corresponding one of the plurality of coefficient coupling circuits 86, 88, 90, 92, and 94. Each one of the coefficient coupling circuits 86, 88, 90, 92, and 94 is further coupled to the divider circuit 96 and to the reference potential node 22. Note that coefficient circuit 84 is further illustrated to include a current source 12 and is representative of the other coefficient circuits 76, 78, 80, and 82. Coefficient coupling circuit 94 is further illustrated to include the gating circuit 16 and the switch circuit 14 and is representative of the other coefficient coupling circuits 86, 88, 90, and 92.

In operation, an m-bit digital data stream 100 is received by the sigma-delta modulator 72 and converted to a 1-bit digital data stream 102. The 1-bit digital data stream 102 is clocked, at the clock rate 104, a bit at a time into the shift register 74. Each bit in the shift register 74 is provided to the corresponding coefficient circuit 86, 78, 80, 82 and 84 and to the corresponding coefficient coupling circuit 86, 88, 90, 92, and 94. Focusing on coefficient circuit 84 and coefficient coupling circuit 94, which provide an illustrative example for the other coefficient circuits and coefficient coupling circuits, the digital data 106 is provided to the current source 12 of the coefficient circuit 84 and to the gating circuit 16 of the coefficient coupling circuit 94. The gating circuit 16 also receives the clock pulse signal 24 via another input. Note that the clock pulse signal 24 is derived from the clock 104, such that switching within the switch circuit 14 is dependent on the clock 104 and not the data 106. With such a dependency, any noise generated because of the switching can be filtered out because it is not data dependent.

The switching of the current between the divider circuit 96 and the reference potential node 22 is similar to the switching described above with reference to FIGS. 1 and 2. In summary, when the clock pulse signal 24 is in a first state, the current 18 is routed to the reference potential node 22. When the clock pulse signal 24 is in a second state, the current is routed to the divider circuit 96 when the digital data 106 is in a second state (Eg. is a logic '1') and the current is routed to the reference potential node 22 when the digital data 106 is in a first state. When the current is routed to the divider circuit 96, it is amplified by amplifier 98 to produce an analog output 112. Note that where the coefficient coupling circuit is connected to the divider circuit 96 affects the magnitude of the FIR coefficient of the digital data 106. For example, coefficient coupling circuits 86, 88, 90, 92, and 94 that are coupled closer to the reference potential node 22, have smaller coefficient magnitudes than those coupled closer to the summing node 108.

Figure 4:
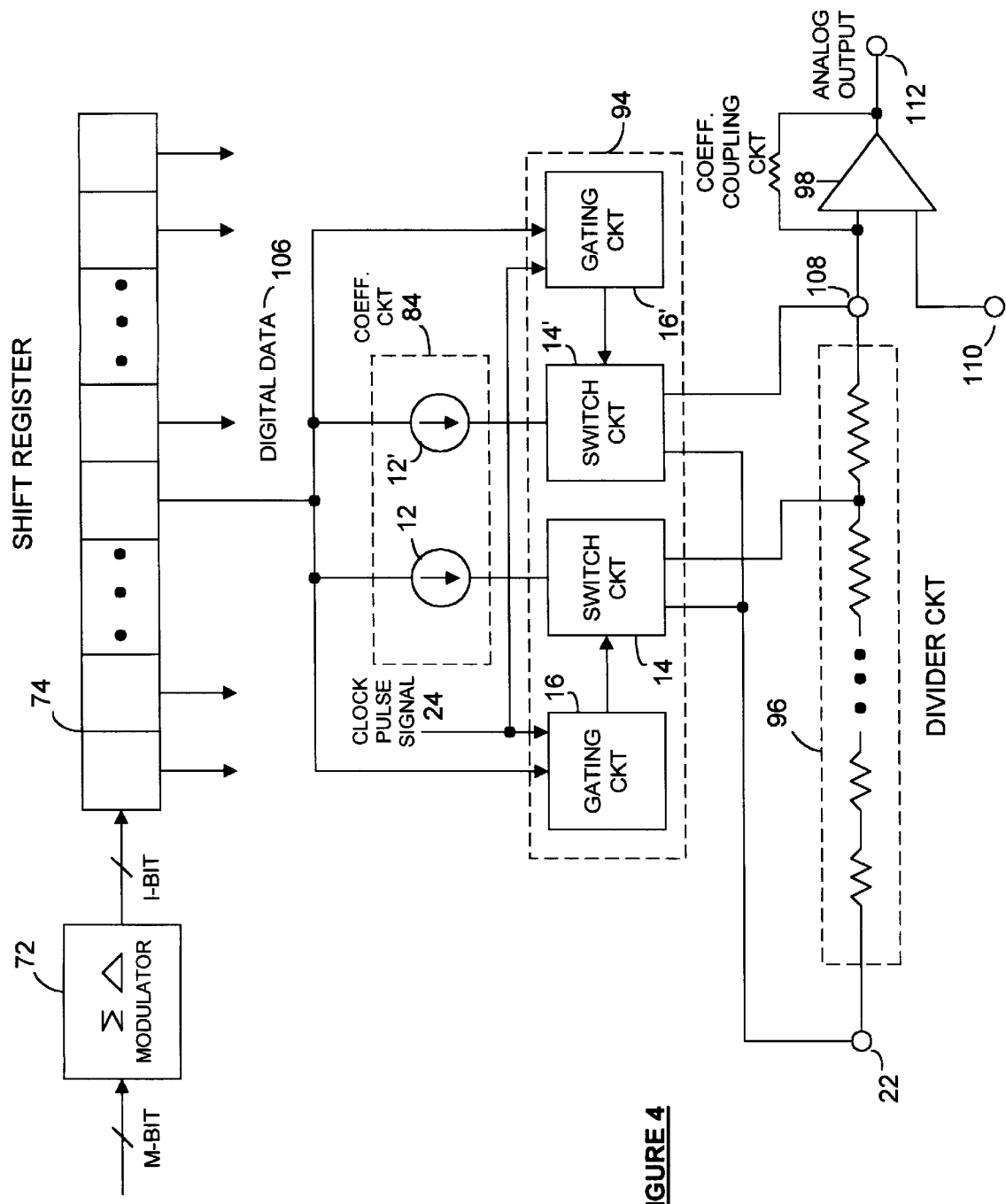
FIG. 4 illustrates a variant embodiment of the digital to analog converter of FIG. 3.

FIG. 4 illustrates a variant embodiment of the digital to analog converter (DAC) 70 of FIG. 3. As shown the DAC 70 includes the sigma-delta modulator 72, the shift register 74, the plurality of coefficient circuits 76,78, 80, 82, and 84 (only coefficient circuit 84 is shown), the plurality of coefficient coupling circuits 86, 88, 90, 92, and 94 (only coefficient coupling circuit 94 is shown), the divider circuit 96, and the amplifier 98. As shown, the coefficient circuit 84 includes two current sources 12 and 12'. Correspondingly, the coefficient coupling circuit 94 includes two sets of gating circuits 16 and 16' and switch circuits 14 and 14'. The divider circuit 96 is shown to include a plurality of resisters serially coupled, wherein the nodes between resistors provides a coupling point for the plurality of coefficient coupling circuits 86, 88, 90, 92, and 94.

In operation, only some of the coefficient circuits 76, 78, 80, 62, and 84 will include two current sources 12 and 12', while the remaining coefficient circuits will include only one current source 12. Correspondingly, the coefficient coupling circuits 86, 88, 90, 92, and 94 coupled to the coefficient circuits having two current sources 12 and 12' will have two sets of gating circuits 16 and 16' and switch circuits 14 and 14'. Which coefficient circuits that have two current sources dependent one which location of the shift register 74 they are coupled to and the desired magnitude of the coefficient. Typically, the FIR filter will have a bell shape curve, thus the coefficient circuits coupled to the inner locations, or registers, of the shift register 74 will have larger coefficients than the coefficient circuits coupled to the outer registers. Thus, the coefficient circuits providing the larger FIR coefficients will have two current sources, while the coefficient circuits providing the smaller FIR coefficients will have only one current source coupled as shown in FIG. 3.

The coefficient coupling circuit 94 provides current from current source 12' to the summing node and current from current source 12 to the divider circuit 96 when the digital data 106 and the clock pulse signal 24 are in the second state (Eg. a logic '1'). The current from both current sources 12 and 12' is provided the reference potential node 22 when the clock pulse signal 24 is in the second state and the digital data 106 is in the first state (Eg. a logic '0'). The current from both currents sources 12 and 12' is provided to both the reference potential node 22 and the divider circuit 96 (for current from current source 12) or the summing node 108 (for current from current source 12'). By switching the currents in this manner, a make-before-break connection is established, thereby reducing noise associated with a break-before-make switching connection. Noise is further reduced because there is switching at every clock cycle, thus the noise generated from differences caused by no data transition changes and data transition changes and from differences in rise and fall times of the data transitions are clock dependent which can easily be filtered.

Figure 5:
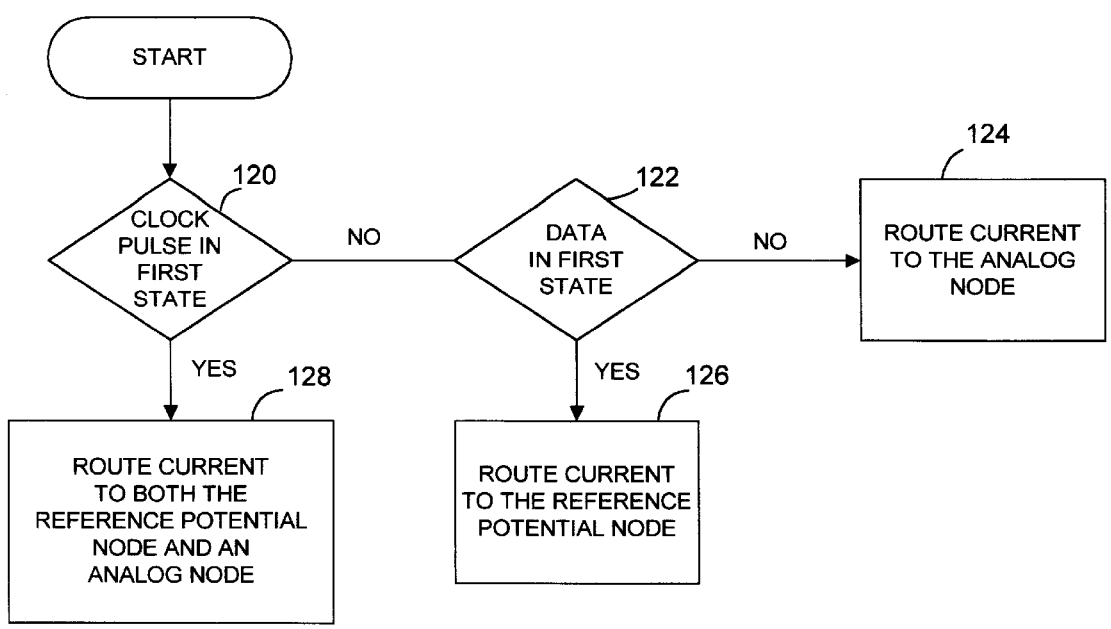
FIG. 5 illustrates a logic diagram that may be used to implement a digital to analog conversion which is in accordance with the present invention.

FIG. 5 illustrates a logic diagram that may be used by a digital processing device, such as a computer, microprocessor, microcontroller, a digital signal processor, or any other device that processes digital information based on operational instructions. The process begins at step 120 where a determination is made as to whether a clock pulse signal is in a first state. If so, the process proceeds to step 128 where current, which is representative of digital data, is routed to both a reference potential node and an analog node. If, however, the clock pulse signal is not in the first state, the process proceeds to step 122 where a determination is made as to whether the digital data is in a first state. If so, the process proceeds to step 126 where the current is routed to the reference potential node. If, however, the digital data is not in the first state, the process proceeds to step 124 where the current is routed to the analog node, which supports an analog representation of the digital data.

Figure 6:
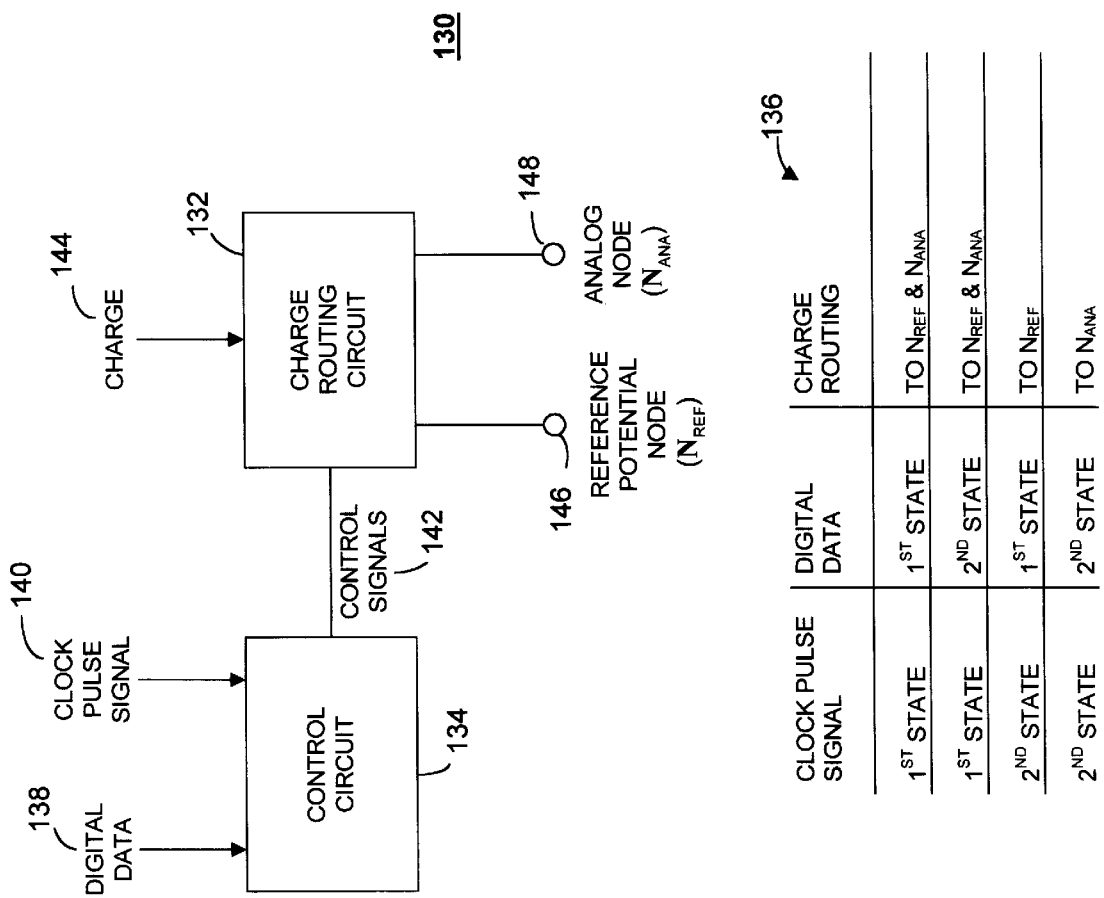
FIG. 6 illustrates another alternate embodiment of a digital to analog converter which is in accordance with the present invention.

FIG. 6 illustrates another alternate embodiment of a digital to analog converter 130 that includes a control circuit 134 and a charge routing circuit 132. The control circuit 134 produces control signals 142 based on the state of its inputs: digital data 138 and clock pulse signal 140. Based on the control signals 142, the charge routing circuit 132 routes a charge 144 to a reference potential node 146, an analog node 148, or both nodes 146 and 148. In this embodiment, the charge 144 is supplied by an energy source and is representative of digital data which could be a current based digital signal or a voltage based digital signal. For voltage based digital signals, the reference potential node 146 is an open connection, while the analog node 148 provides the converted analog representation of the digital data. For current based digital signals, the reference potential node 146 is coupled as mentioned above with references to FIGS. 1–4.

Table 136 illustrates the resulting control signals 142 from the differing states of the inputs 138 and 140. As shown, when the clock pulse signal 140 is in the first state, control signals 142 are produced which cause the charge routing circuit 132 to route the charge 144 to both the analog node 148 and to the reference potential node 146. When the clock pulse signal 140 is in a second state, control signals 142 are produced which cause the charge routing circuit 132 to route the charge 144 to the analog node 148 when the digital data 138 is in a second state and to route the charge 144 to the reference potential node 146 when the digital data 138 is in a first state.

In operation, the clock pulse signal 140 is produced from a system clock which is used to clock in the digital data 138. The duration of the clock pulse signal 140 should be much greater (Eg.>than 10 times) than the switching times of the charge routing circuit 132. When the digital data 138 is clocked in, it is provided to the control circuit 134. When the digital data 138 is in the second state (Eg. a logic '1'), the charge 144 is routed, by a switch circuit within the charge routing circuit 132, to the analog node 148. When the digital data 138 is in the first state (Eg. a logic '0'), the charge 144 is routed, by a switch circuit within the charge routing circuit 132, to the reference potential node 146. When the clock pulse signal 140 is in the first state (Eg. a logic '0'), the charge 144 is routed, by a switch circuit within the charge routing circuit 132, to both nodes 146 and 148.

Figure 7:
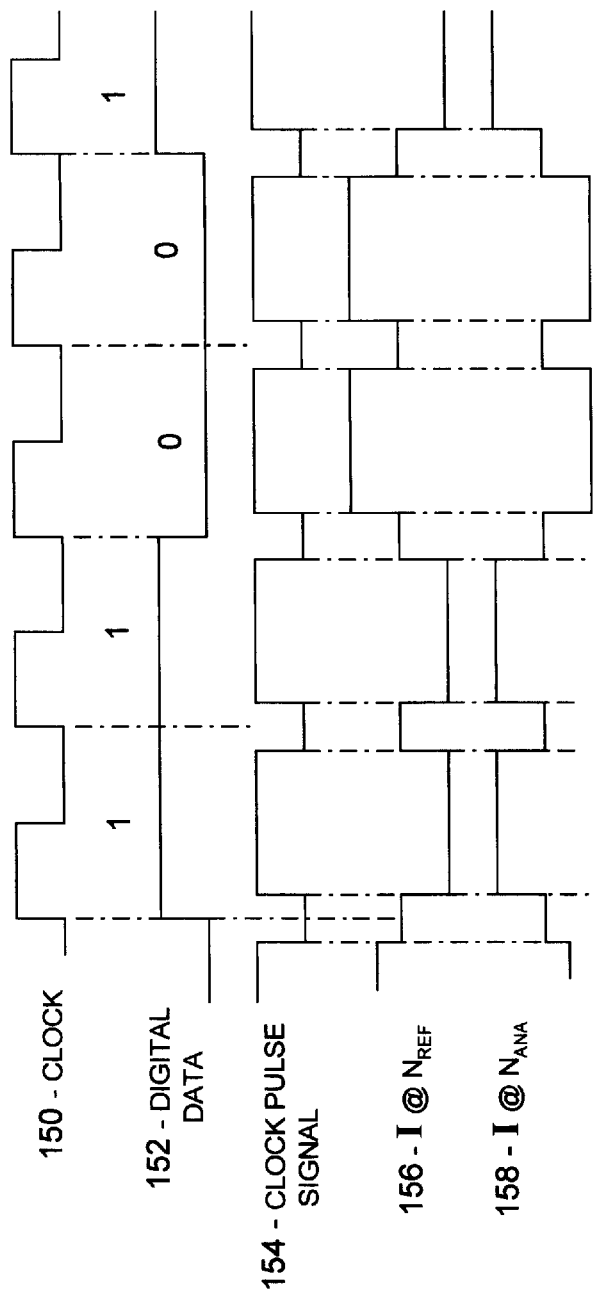
FIG. 7 illustrates a timing diagram of the digital to analog converters which is in accordance with the present invention.

FIG. 7 illustrates a timing diagram of the digital to analog converters of the preceding figures. The timing diagram includes representations for a clock pulse 150 that has a 50% duty cycle, a digital data signal 152, a clock pulse signal 154, current into the reference potential node 156, and the current into the analog node 158. For each leading edge transition of the clock 150, the clock pulse signal 154 transitions low. As a result, the current into both nodes 156 and 158 is shared, where each node 156 and 158 receives about one-half of the current supplied by the current source. When the clock pulse signal 154 transitions high, the current into the nodes 156 and 158 is dependent on the state of the digital data 154. As shown, for the first two clock cycles, the digital data is in a logic '1' state. As a result, current is supplied to the analog node 158 and approximately zero current is supplied to the reference potential node 156. When the digital data 152 is in a logic '0' state, current is supplied to the reference potential node 156 and approximately zero current is supplied to the analog node 158.

As described with reference to the figures, the present invention provides a method and apparatus that substantially eliminates self generated noise. This is accomplished by using control circuitry that causes a make-before-break connection in the switching of currents and by forcing switching at the clock rate instead of at the data rate. The later point is significant because if the noise is generated based on the transitions of the data, it cannot be filtered out; to do so would also filter some of the data. Thus, by making the switching clock dependent, the noise generated by such switching can easily be filtered.

We claim:

1. A digital to analog converter comprising:

a current source, wherein current provided by the current source is representative of digital data;

a switch circuit operably coupled to the current source, a reference potential node, and an analog node, wherein the analog node supports an analog representation of the digital data; and a gating circuit operably coupled to the switching circuit, wherein the gating circuit receives, as inputs, a clock pulse signal and the digital data, wherein the gating circuit provides controlling signals to the switch circuit that causes the switch circuit to route current from the current source to both the reference potential node and the analog node when the clock pulse signal is in a first state, causes the switch circuit to route the current to the reference potential node when the digital data is in a first state and the clock pulse signal is in a second state, and causes the switch circuit to route the current to the analog node when the digital data is in a second state and the clock pulse signal is in the second state.

2. The digital to analog converter of claim 1, wherein the switch circuit includes a pair of transistors, wherein first nodes of the transistors are coupled to the current source, a second node of a first one of the pair of transistors is operably coupled to the reference potential node, and a second node of the second one of the pair of transistors is operably coupled to the analog node.

3. The digital to analog converter of claim 2, wherein the gating circuit comprises a pair of NAND gates, wherein an output of a first one of the pair of NAND gates is operably coupled to a control node of the first one of the pair of transistors, an output of a second one of the pair of NAND gates is operably coupled to a control node of the second one of the pair of transistors, a first input of the first and second ones of the pair of NAND gates is operably coupled to receive the clock pulse signal, a second input of the first one of the pair of NAND gates is operably coupled to receive the digital data, and a second input of the second one of the pair of NAND gates is operably coupled to receive an inverted representation of the digital data.

4. The digital to analog converter of claim 3 further comprises a pair of cascaded inverters operably coupled between the outputs of the pair of NAND gates and the control nodes of the pair of n-channel transistors.

5. The digital to analog converter of claim 1, wherein the reference potential node is operably coupled to one of at least: a circuit ground or a virtual ground.

6. A digital to analog converter comprising:
   a sigma-delta modulator that converters a multi-bit digital data stream into a one-bit digital data stream;
   a shift register operably coupled to the sigma-delta modulator, wherein the shift register receives the one-bit digital data stream and clocks the one-bit digital data stream through the shift register at a rate of the sigma-delta modulator;
   a plurality of coefficient circuits, wherein each one of the plurality of coefficient circuits is operably coupled to a corresponding location in the shift register, and wherein each one of the plurality of coefficient circuits includes at least one current source;
   an operational amplifier having a first input, a second input, and an output, wherein the second input is operably coupled to a circuit reference node and wherein the first input is operably coupled to a summing node;
   a divider circuit operably coupled between the summing node and the reference potential node;
   a plurality of coefficient coupling circuits, wherein each of the plurality of coefficient coupling circuits includes:
      a switch circuit operably coupled to the at least one current source of a corresponding one of the plurality of coefficient circuits, to the reference potential node, and the dividing circuit; and
      a gating circuit operably coupled to the switching circuit, wherein the gating circuit receives, as inputs, clock pulse signal and digital data from the shift register, wherein the gating circuit provides controlling signals to the switch circuit that causes the switch circuit to route current from the at least one current source to both the reference potential node and the divider circuit when the clock pulse signal is in a first state, causes the switch circuit to route the current to the reference potential node when the digital data is in a first state and the clock pulse signal is in a second state, and causes the switch circuit to route the current to the divider circuit when the digital data is in a second state and the clock pulse signal is in the second state.

7. The digital to analog converter of claim 6, wherein at least some of the plurality of coefficient circuits further comprises a second current source; wherein corresponding ones of the plurality of coefficient coupling circuits operably coupled to the at least some of the plurality of coefficient circuits further comprise:
   a second switch circuit operably coupled to the second current source of the corresponding one of the plurality of coefficient circuits to the reference potential node, and to the summing circuit; and
   the gating circuit further provides control signals to the second switch circuit to that causes the second switch circuit to route current from the second current source to both the reference potential node and the summing node when the clock pulse signal is in a first state, causes the second switch circuit to route the current to the reference potential node when the digital data is in a first state and the clock pulse signal is in a second state, and causes the second switch circuit to route the current to the summing node when the digital data is in a second state and the clock pulse signal is in the second state.

8. The digital to analog converter of claim 6, wherein the switch circuit further comprises a pair of N-channel transistors or P-channel transistors.

9. The digital to analog converter of claim 6, wherein the gating circuit further comprises a pair of NAND gates operably coupled to receive, as inputs, the digital data and the clock pulse signal.

10. The digital to analog converter of claim 6 further comprises cascaded inverters operably coupled between the switch circuit and the gating circuit of each of the plurality of coefficient coupling circuits.

11. A method for converting a digital signal to an analog signal, the method comprising the steps of:
   a) routing current to both a reference potential node and an analog node when a clock pulse signal is in a first state, wherein the current is representative of digital data;
   b) routing the current to the reference potential node when the clock pulse signal is in a second state and the digital data is in a first state; and
   c) routing the current to the analog node when the clock pulse signal in is the second state and the digital data is in a second state such that the analog node supports an analog representation of the digital data.

12. The method of claim 11 further comprising dividing the current of step c to provide trimming of a potential at the analog node.

13. A digital to analog converter comprising:
   a charge routing circuit operably coupled to a reference potential node and an analog node, wherein the charge routing circuit routes a charge that represents digital data; and
   a control circuit operably coupled to the charge routing circuit, wherein the control circuit provides controlling signals to the charge routing circuit that causes the charge routing circuit to route the charge to both the reference potential node and the analog node when a clock pulse signal is in a first state, causes the charge routing circuit to route the charge to the reference potential node when the digital data is in a first state and the clock pulse signal is in a second state, and causes the charge routing circuit to route the charge to the analog node when the digital data is in a second state and the clock pulse signal is in the second state such that the analog node supports an analog representation of the digital data.

14. The digital to analog converter of claim 13, wherein the charge routing circuit further comprises an energy source that generates the charge and a switch circuit that is operably coupled to the control circuit.

* * * * *